United States Patent

Rettig

[15] 3,668,093

[45] June 6, 1972

[54] PHOTOINITIATION OF VINYL POLYMERIZATION BY TRIAROYLPHOSPHINES

[72] Inventor: Thomas Albert Rettig, Wilmington, Del.

[73] Assignee: E. I. du Pont de Nemours and Company, Wilmington, Del.

[22] Filed: May 6, 1971

[21] Appl. No.: 140,987

[52] U.S. Cl. ................. 204/159.23, 204/159.22, 260/545 P, 260/935

[51] Int. Cl. ......................................... C08d 1/00, C08f 1/16

[58] Field of Search ............... 204/159.23, 159.24; 96/115 P

[56] References Cited

UNITED STATES PATENTS 3,331,761 7/1967 Mao ................................. 204/159.23

OTHER PUBLICATIONS

Eldred, Journal of Polymer Science, A–1, 7, 265 (1969).

*Primary Examiner*—Murray Tillman
*Assistant Examiner*—Richard B. Turer
*Attorney*—Anthony P. Mentis

[57] ABSTRACT

Acyl phosphines of the formula $$\begin{array}{c} R^1 \\ | \\ R^2\text{—}P\text{—}R^3 \end{array}$$

wherein $R^1$, $R^2$ and $R^3$, alike or different, are aryl or aroyl groups having up to 13 carbon atoms and such aryl or aroyl groups substituted with halogen of atomic number 9-35, alkyl of up to six carbon atoms, or alkoxy of up to six carbon atoms, with the proviso that at least one of $R^1$, $R^2$ and $R^3$ is aroyl, are effective as photoinitiators for photopolymerization of ethylenically unsaturated compounds. Compositions containing such an acyl phosphine and an ethylenically unsaturated compound are useful in preparing photoimaging compositions, adhesives, coating compositions and the like.

13 Claims, No Drawings

PHOTOINITIATION OF VINYL POLYMERIZATION BY TRIAROYLPHOSPHINES

BACKGROUND OF THE INVENTION

1. Field of the Invention

This invention relates to photopolymerizable compositions comprising a phosphine containing at least one aroyl group and a compound capable of undergoing a free radical addition polymerization with light having wavelength of 200–435 nanometers (nm). The photopolymerization can be carried out in air and is particularly adapted to polymerization of ethylenically unsaturated compounds in the solid phase.

2. Description of Prior Art

Photopolymerization, i.e., polymerization brought about by light, is a well-known process that is important in fields such as graphic arts and information storage. Compositions comprising an ethylenic monomer and a photoinitiator such as triphenylphosphine, however, have certain disadvantages which limit their usefulness. T. J. Mao et al., J. Polym. Sci. A–1, 5, 1741 (1967) report that triphenylphosphine fails to initiate the photopolymerization of styrene. See also T. J. Mao, U.S. Pat. No. 3,331,761. Tri-o-tolyphosphine has been reported as a photoinitiator by R. J. Eldred, J. Polym. Sci. A–1, 7, 265 (1969) but it is not completely satisfactory.

DESCRIPTION OF THE INVENTION

It has now been found that a selected class of acyl phosphines are effective photoinitiators for the free radical polymerization of ethylenically unsaturated compounds. The invention is a photopolymerizable composition comprising (a) and effective amount of at least one acyl phosphine of the formula $$R^2-\overset{\displaystyle R^1}{\overset{|}{P}}-R^3$$

wherein $R^1$, $R^2$ and $R^3$, alike or different, are aryl or aroyl groups having up to 13 carbon atoms and such aryl or aroyl groups substituted with halogen of atomic number 9–35, alkyl of up to six carbon atoms, or alkoxy of up to six carbon atoms, with the proviso that at least one of $R^1$, $R^2$ and $R^3$ is aroyl, and (b) at least one ethylenically unsaturated compound capable of undergoing a free radical addition polymerization with light having a wavelength of 200–435 nanometers.

Preferred are compositions of the above type which are predominantly crystalline. Such crystalline compositions are generally photopolymerizable in air with little or no retardation.

Any non-gaseous ethylenically unsaturated compound that is capable of forming a polymer by a free radical initiated chain propagating addition polymerization may be used in the practice of this invention. For convenience in handling operations, the monomers are generally liquids which boil above about 40° C. or solids. Lower boiling liquid monomers may be employed by using conventional closed apparatus systems that are transparent to the wavelength of light desired. The solid monomers provide especially useful systems that are insensitive to air and provide compositions suitable for high resolution imagewise photopolymerization. While it is not necessary to exclude oxygen, the process can be carried out in its absence.

Ethylenic compounds which may be used include:

TABLE I 2,6-Bis(acryloxymethyl)naphthalene, m.p., 65° C.
2,6-Bis(methacryloxymethyl)naphthalene, m.p., 89° C.
p-Xylylene diacrylate, m.p., 76° C.
Acrylamide, m.p., 85° C.
p-Xylylene-bis-α-chloroacrylate, m.p., 77° C.
4,4'-Bis(acryloxybiphenyl), m.p., 61° C.
4,4'-Bis(acryloxybenzophenone), m.p., 110° C.
Tetrafluorohydroquinone diacrylate, m.p., 88° C.
8-Acryloxyquinoline, m.p., 56° C.
6-Acryloxyhexyl dimethylammonium-p-toluenesulfonate, m.p., 88°–90° C.

N-6-Acryloxyhexyl-N,N-dimethylphenacylammonium bromide, m.p., 155° C.
Trimethyl-2-acryloxymethylammonium iodide, m.p., 136° C.
N-Vinylsuccinimide, m.p., 48° C.
4-Acryloxy-4'-dimethylaminobenzophenone, m.p., 104°–105.5° C.
Calcium diacrylate, m.p., >300° C.
N-Vinyl pyrrolidone, liquid, b.p. 95° C./13 mm.
N-(2-Acryloxyethyl)succinimide, m.p., 43° C.
p-Bis(acryloxyethyl)benzene, m.p., 49° C.
2-Vinylnaphthalene, m.p., 64°–65° C.
N-Vinylcarbazole, m.p., 67° C.
N-Isopropylacrylamide, m.p., 67° C.
N-Vinylphthalimide, m.p., 83° C.
Hydroquinone diacrylate, m.p., 88° C.
N-p-Methoxyphenylmethacrylamide, m.p., 92° C.
N-o-Tolylmethacrylamide, m.p., 98° C.
N-Phenyl-N-methylacrylamide, m.p., 75° C. (prepared from reaction of acrylyl chloride with N-methyl aniline)
4-Acryloxybenzophenone, m.p., 46° C.
Methyl methacrylate, b.p., 100° C.
Acrylonitrile, b.p., 78° C.

Additional compounds which can be used are the alkylene glycol diacrylates disclosed in Martin et al. U.S. Pat. No. 2,927,022 issued Mar. 1, 1960, for example those wherein the ethylenically unsaturated groups, especially the vinylidene groups, are conjugated with ester or amide structures. The following specific compounds are illustrative of this class: unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri- and tetramethacrylate, pentaerythritol di, tri- and tetraacrylates, dipentaerythritol hexacrylate, tri-pentaerythritol octaacrylate, mannitol hexaacrylate, sorbitol hexaacrylate, inositol hexaacrylate and the corresponding methacrylates, 1,3-propanediol diacrylate, 1,5-pentanediol dimethacrylate, and the like; unsaturated amides, particularly those of the alpha-methylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis-(gamma-methacrylamidopropoxy)ethane, beta-methacrylamidoethyl methacrylate, N-(beta-hydroxyethyl)beta-(methacrylamido)ethyl acrylate and N,N-bis(beta-methacryloxyethyl)acrylamide; vinyl esters, such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as hexadienal.

The acyl phosphines are used in amounts which are effective in promoting the polymerization of the ethylenic monomer and this can be easily determined for any particular combination of initiator and monomer. In general the amount of the initiator will be from about 0.01 to 20 percent by weight based on the weight of the monomer. Preferred is the range of 0.20 to 20 percent.

The acyl phosphines can generally be prepared by the reaction of aroyl halides with phosphine in the presence of pyridine or other acid acceptors [cf. E. Plazek & R. Tyka, Chem. Abstracts, 53, 21750 (1959) — see also Plazek & Tyka, Bull. Acad. Pol. Sci., 9, 577 (1961), in which tri-1 and -2-naphthoylphosphines and m- and p-tolylphosphines are reported].

EXAMPLE A

Tribenzoyl Phosphine $$R^1=R^2=R^3=-\overset{O}{\overset{\|}{C}}-C_6H_5$$

$$PH_3 + 3C_6H_5\overset{O}{\overset{\|}{C}}-Cl \longrightarrow (C_6H_5CO)_3P$$

The synthesis of tribenzoyl phosphine is as follows. A 500-ml three-neck flask was fitted with a magnetic stirrer, gas inlet tube and gas exit tube. The gas exit tube was connected in turn to a bubbler and a dry ice trap, the exit of which was allowed to flow into a Bunsen burner flame. The gas inlet tube is connected in series with a bubbler, dry ice trap and phosphine cylinder. The flask was charged with 48 g of benzoyl chloride and 89 g of pyridine (dried over molecular sieves). The entire gas train was then degassed with nitrogen. Phosphine was then bubbled through the reaction mixture at room temperature for 2.5 hours. At the end of this period no more phosphine was being absorbed by the reaction mixture. Nitrogen was then bubbled through the gas train while the flask was heated gradually to 60° C.

During the first part of the heating, the reaction mixture absorbed the phosphine remaining in the gas train as evidenced by gas uptake. Phosphine gas was liberated from the reaction mixture during the last part of the heating period. The heating and nitrogen flow were continued until no more combustion of the liberated phosphine was observed. The reaction mixture was then cooled to room temperature and filtered to remove the precipitate of pyridine hydrochloride. The dark brown mother liquor then dissolved in 500 ml of ether. The ethereal solution was then extracted with three 300-ml portions of ice cold 3M HCl, followed by two 100-ml portions of 5% $NaHCO_3$. A yellow precipitate that formed in the organic layer was dissolved by adding chloroform. The organic layer was then extracted once with saturated $NaHCO_3$ and dried over $Na_2SO_4$. Evaporation of the solvent in a rotary evaporator gave 38 g of a yellow oil which solidified to a yellow brown solid upon standing. A portion of the crude solid was recrystallized twice from absolute ethanol to give tribenzoylphosphine as a bright yellow solid, mp 147°–148° C. (Lit. 148°–149° C — R. Tyka, E. Plazek, Roczniki Chemii, 37, 283 (1963)).

Examples B, C, D, and E further exemplify the synthesis of aroyl phosphines suitable for the practice of this invention.

EXAMPLE B

Diphenylbenzoylphosphine $$R^1=R^2=-C_6H_5$$

$$R^3=-\overset{O}{\overset{\|}{C}}-C_6H_5$$

$$(C_6H_5)_2PH + C_6H_5\overset{O}{\overset{\|}{C}}Cl \xrightarrow[\text{Ether}]{(C_6H_5)_3N} C_6H_5\overset{O}{\overset{\|}{C}}P(C_6H_5)_2$$

A 1-liter three-neck flask was charged with diphenyl phosphine (9.3 g, 0.05 mol) in a nitrogen atmosphere. The flask was fitted with a magnetic stirring bar and pressure equalized dropping funnel. A solution of triethylamine (5.0 g, 0.05 mol) in ether (100 ml, anhydrous) was added and the flask cooled to 0°–5° C with constant stirring while maintaining a nitrogen atmosphere. Benzoyl chloride (neat, 7.0 g, 0.05 mol) was then added dropwise at 0°–5° C, giving an immediate yellow color and white precipitate. The reaction mixtures was then stirred for two hours at room temperature after the addition of benzoyl chloride. The reaction mixture was then filtered in a nitrogen atmosphere dry box, the filter cake washed with 300 ml of anhydrous ether to remove the yellow color, leaving a white solid which was triethylamine hydrochloride. The yellow mother liquor was then evaporated in vacuo to give a bright yellow solid (14.5 g, 97%), m.p. 82°–84.5° C [lit. 81° — K. Issleib, E. Priebe, Chem. Ber. 92, 3183 (1959)].

Anal. Calcd. for $C_{19}H_{15}PO$:

| | | | |
|---|---|---|---|
| Found: | C, 78.59; | H, 5.20; | O, 5.50 |
| | C, 78.29; | H, 5.185.18; | O, 4.29 |
| | 77.96 | 5.20 | 4.91. |

EXAMPLE C p-Dimethylaminobenzoyldiphenylphosphine $$R^1=R^2=-C_6H_5$$

$$R^3=-\overset{O}{\overset{\|}{C}}-C_6H_4-N(CH_3)_2$$

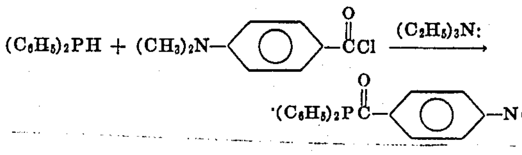

A 500-ml round-bottom flask was charged with diphenyl phosphine (6 g, 0.0332 mol), triethylamine (3.4 g, 0.034 mol) and tetrahydrofuran (dry, 100 ml). 4-Dimethylaminobenzoyl chloride (6 g, 0.033 mol) in 50 ml of dry dimethyl acetamide was then added in one portion at 0.5° C. The solution was then refluxed for 18 hours during which time a yellow color formed and a white solid precipitated. The reaction mixture was cooled and filtered. The mother liquor was evaporated in vacuo to give an oil which crystallized upon standing.

The resultant solid was crushed on a clay plate to give yellow crystals, mp 142°–143.5° C.

EXAMPLE D

Dibenzoylphenylphosphine $$R^1=R^2=-\overset{O}{\overset{\|}{C}}-C_6H_5$$

$$R^3=-C_6H_5$$

$$C_6H_5PH_2 + 2C_6H_5COCl + 2(C_2H_5)_3N \longrightarrow \left(C_6H_5\overset{O}{\overset{\|}{C}}\right)_2PC_6H_5 + 2(C_2H_5)_3N\cdot HCl$$

Phenyl phosphine (5.5 g, 0.05 mol) was placed in a 1-liter, 3-neck flask in a nitrogen atmosphere dry box. Benzene (300 ml) and triethylamine (10.5 g, 0.105 mol) were then added. Benzoyl chloride (14.0 g, 0.10 mol) was then added dropwise at room temperature in a nitrogen atmosphere, giving an immediate yellow color and white precipitate in the solution. After the addition, the solution was stirred for 1 hour at reflux. The white precipitate (triethylamine hydrochloride) was filtered from the cooled solution and the mother liquor evaporated in vacuo to give a bright yellow slightly gummy solid (12.5 g, 78.5%).

EXAMPLE E

Bis(p-dimethylaminobenzolyphenylphosphine $$R^1=-C_6H_5$$

$$R^2=R^3=-\overset{O}{\overset{\|}{C}}-C_6H_4N(CH_3)_2$$

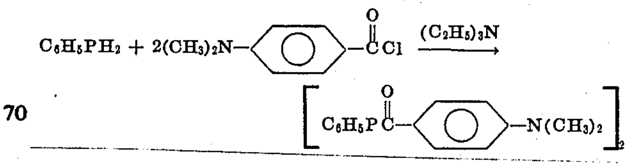

Phenyl phosphine (4.5 g, 0.041 mol), 4-dimethylaminobenzoyl chloride (15.0 g, 0.082 mol), triethylamine (8.8 g, 0.087 mol) and benzene (300 ml) were reacted as in Example D with a reaction time of 48 hours at benzene reflux. The yellow solution was cooled and filtered. The filter cake (principally triethylamine hydrochloride) was washed with 50 ml of benzene and the combined mother liquors evaporated in vacuo to give a tacky solid which was triturated three times with n-chlorobutane to give a yellow powder, mp 152°–182° C (12.5 g, 75%).

Any aroyl halide, i.e., fluoride, chloride, bromide or iodide, can be used but, since the chlorides are generally more readily available and are more economical, they are preferred. When the procedure of Example A above is repeated with the aroyl halides of the following column A of Table II, one obtains the corresponding triaroylphosphines in column B:

TABLE II

| A | B |
|---|---|
| m-Toluoyl chloride | Tris(m-toluoyl)phosphine |
| p-Toluoyl chloride | Tris(p-toluoyl)phosphine |
| o-Chlorobenzoyl chloride | Tris(o-chlorobenzoyl)phosphine |
| p-Chlorobenzoyl chloride | Tris(p-chlorobenzoyl)phosphine |
| p-Methoxybenzoyl chloride | Tris(p-methoxybenzoyl)phosphine |
| o-Methoxybenzoyl chloride | Tris(o-methoxybenzoyl)phosphine |
| p-Ethoxybenzoyl chloride | Tris(p-ethoxybenzoyl)phosphine |
| o-Bromobenzoyl chloride | Tris(o-bromobenzoyl)phosphine |
| m-Bromobenzoyl chloride | Tris(m-bromobenzyl)phosphine |
| p-Bromobenzoyl chloride | Tris(p-bromobenzoyl)phosphine |
| o-Fluorobenzoyl chloride | Tris(o-fluorobenzoyl)phosphine |
| m-Fluorobenzoyl chloride | Tris(m-fluorobenzoyl)phosphine |
| p-Fluorobenzoyl chloride | Tris(p-fluorobenzoyl)phosphine |
| p-Trifluoromethylbenzoyl chloride | Tris(p-trifluoromethylbenzoyl)-phosphine |
| 2,5-Dimethylbenzoyl chloride | Tris(2,5-dimethylbenzoyl)-phosphine |
| 3,5-Dimethylbenzoyl chloride | Tris(3,5-dimethylbenzoyl)-phosphine |
| 2,4-Dimethylbenzoyl chloride | Tris(2,4-dimethylbenzoyl)-phosphine |
| p-Ethylbenzoyl chloride | Tris(p-ethylbenzoyl)phosphine |
| p-t-Butylbenzoyl chloride | Tris(p-t-butylbenzoyl)phosphine |
| p-Phenylbenzoyl chloride | Tris(p-phenylbenzoyl)phosphine |
| m-Phenylbenzoyl chloride | Tris(m-phenylbenzoyl)phosphine |
| p-Hexylbenzoyl chloride | Tris(p-hexylbenzoyl)phosphine |
| 2-Fluoroenecarbonyl chloride | Tris(2fluorenec arbonyl)phosphine |
| p-Butoxybenzoyl chloride | Tris(p-butoxybenzoyl)phosphine |
| p-Hexyloxybenzoyl chloride | Tris(p-hexyloxybenzoyl)phosphine |
| 1-Naphthoyl chloride | Tris(1-naphthoyl)phosphine |
| 2-Naphthoyl chloride | Tris(2-naphthoyl)phosphine |
| 7-Methoxy-1-naphthoyl chloride | Tris(7-methoxy-1-naphthoyl)-phosphine |
| 5-Methoxy-1-naphthoyl chloride | Tris(5-methoxy-1-naphthoyl)-phosphine |
| 8-Methoxy-1-naphthoyl chloride | Tris(8-methoxy-1-naphthoyl)-phosphine |
| 1-Methoxy-2-naphthoyl chloride | Tris(1-methoxy-2-naphthoyl)-phosphine |
| 3-Ethoxy-2-naphthoyl chloride | Tris(3-ethoxy-2-naphthoyl)-phosphine |
| 6-Methoxy-2-naphthoyl chloride | Tris(6-methoxy-2-naphthoyl)-phosphine |
| 2-Chloro-1-naphthoyl chloride | Tris(2-chloro-1-naphthoyl)-phoshine |
| 5-Chloro-1-naphthoyl chloride | Tris(5-chloro-1-naphthoyl)-phosphine |
| 1-Chloro-2-naphthoyl chloride | Tris(1-chloro-2-naphthoyl)-phosphine |
| 3-Chloro-2-naphthoyl chloride | Tris(3-chloro-2-naphthoyl)-phosphine |
| 5-Chloro-2-naphthoyl chloride | Tris(5-chloro-2-naphthoyl)-phosphine |

Triaroylphosphines with mixed aroyl groups can be made by stepwise replacements of the phosphine hydrogens.

When the procedures of Examples A–E are repeated, using the aroyl halide of col. 1 with the phosphine in col. 2 of Table III, the product shown in col. 3 is obtained.

TABLE III

| Column 1 | Column 2 | Column 3 |
|---|---|---|
| p-Toluoyl chloride | Di(p-methoxyphenyl) phosphine. | p-Toluoyl di(p-methoxyphenyl)-phosphine. |
| m-Fluorobenzoyl chloride | Di(p-tolyl)phosphine | m-Fluorobenzoyl di (p-tolyl)-phosphine. |
| p-Chlorobenzoyl chloride. | Bis(p-iPr-phenyl) phosphine. | p-Chlorobenzoyl bis (p-iPr-phenyl) phosphine. |
| p-Dimethylamino-benzoyl. | Bis(p-dimethyl-aminophenyl) phosphine. | p-Dimethylamino-benzoyl bis(p-dimethylamino-phenyl) phosphine. |
| 2,4-dimethoxybenzoyl chloride. | 2,5-dichlorophenyl phosphine. | Bis(2,4-dimethoxy-benzoyl)-2,5-dichlorophenyl phosphine. |
| Bromobenzoyl chloride. | 3,4-dimethoxyphenyl phosphine. | Bis(bromobenzoyl)-3,4-dimethoxy-phenyl phosphine. |
| Di-n-butylamino-benzoyl chloride. | Di(p-bromophenyl) phosphine. | Di-n-butylamino-benzoyl bis(p-bromophenyl) phosphine. |
| m-Fluorobenzoyl chloride. | Di(m-fluorophenyl) phosphine. | m-Fluorobenzoyl bis (m-fluorophenyl) phosphine. |
| p-Phenylbenzoyl chloride. | Naphthylphenyl phosphiue. | p-Phenylbenzoyl naphthylphenyl phosphine. |
| α-Naphthoyl chloride | 2,6-dichlorophenyl-p-tolyl phosphine. | α-Naphthoyl-2,6-dichlorophenyl-p-tolyl phosphine. |
| m-n-Hexylbenzoyl chloride. | Di(hexyloxyphenyl) phosphine. | m-n-Hexylbenzoyl bis (hexyloxyphenyl) phosphine. |

Actinic light suitable for initiating polymerization according to this process should be rich in radiation within the range of 200–435 nm and preferably in the range 300–435 nm. Suitable light sources may be found among carbon arcs, hydrogen discharge tubes, mercury vapor lamps, tungsten-iodine lamps, and various incandescent lamps.

The examples show polymerization of methyl methacrylate at 435 nm when tribenzoylphosphine is present as the photoinitiator, whereas triphenylphosphine gives no more polymer than a blank sample under the same conditions. This illustrates the wavelength sensitivity of the claimed compositions. In addition, calorimetric studies with monochromatic light show photoinitiation of polymerization of N-vinylsuccinimide by tribenzoylphosphine at 366, 405 and 435 nm.

A simple method to measure the amount and rate of photopolymerization is based upon the fact that polymerization evolves heat. A photocalorimeter may be used to measure the temperature difference between a surface coated with a photosensitive composition and an identical non-sensitive control surface when both surfaces receive and absorb exactly the same amount of light. In this instrument, two identical semicircular copper plates, 3 mm thick and with a radius of 11 mm, are mounted on wooden posts which are 1 mm thick and 13 mm long, using a suitable glue such as an epoxy resin. The posts are attached to an aluminum block which is mounted within an air-tight chamber having a vacuum port. The copper plates are coplanar with 1 mm separation between their straight edges and are joined together by a short length of 5-mil constantan wire. A short length of 5-mil copper wire is attached to each plate and to thick insulated copper wire running to a voltage amplifier. The amplifier is connected to the recorder such as a Moseley XY recorder (10 mv full scale). The plates are protected from ambient temperature fluctuations by means of the air-tight chamber which is provided with a quartz window for the entry of light. One copper plate is blackened so as to absorb all incident light and acts as a control. The crystalline photopolymerizable composition is applied to the other plate and light is shown through the quartz window onto both plates. An electric potential is created at each junction of the constantan wire with the plates. A thermal difference is created when the composition polymerizes and the difference in temperature is displayed as a voltage on the Y axis of the XY recorder. The X axis is a time scale. Thus, since the polymerization evolves heat, the recorder traces a curve with a slope proportional to the polymerization rate. If no polymerization occurs, a straight line parallel to the X axis is traced.

Lithographic printing plates can be made by photopolymerizing N-vinylsuccinimide with tribenzoylphosphine using a tungsten-iodine lamp. Under these conditions, triphenyl-phosphine does not give a useable polymer image. Thus, an important distinction and advantage of tribenzoylphosphine versus triphenylphosphine is that wavelengths of light above 300 nm may be used for photopolymerization. Accordingly, ordinary glass reactions vessels and optical systems may be used, and other light sources (tungsten-iodine lamp) may be used instead of a mercury arc lamp.

Photopolymerizations are generally and preferably carried out at ambient temperatures, i.e., at about 50° to 90° F. Certain initiator/monomer systems may be slow at such temperatures and it is customary to warm these to temperatures as high as 100° C.

Most polymerizable compositions of this invention can be polymerized to a practical degree in a few minutes, i.e., 1 to about 5 minutes. This is not critical, however, and exposures may last as long as an hour. Slow polymerization is often desirable, e.g., in bulk casting so that the normal shrinking that accompanies polymerization can occur in a manner to avoid bubble formation.

Solvents, binders and other additives are not critical to the polymerization process but may be used for any of the purposes peculiar to the ultimate use of the polymer. For example, binders may be desirable in the preparation of letterpress printing plates or as fillers in the preparation of solid castings. Solvents may be useful in preparing adhesives and coating compositions, In addition to the uses already mentioned the compositions can also be used for preparing films, fibers, transparent projection slides, lithographic plates, photoresists, photoactive cements and the like.

The compositions can be prepared as colloidal suspensions or as predominantly crystalline solids. Crystalline preparations can be obtained by various methods as for example by melting the initiator and ethylenic monomer together to form a homogenous melt which is coated onto a suitable substrate such as glass, metal, paper, etc. and allowed to crystallize. Another method is to dissolve the initiator and ethylenic monomer in a suitable solvent, putting the solution on a substrate, and then causing the solvent to evaporate and deposit the two components in crystalline state on the substrate. Other methods may also be used.

When a reactor is used, the process can be carried out in conventional chemical equipment that transmits ultraviolet radiation, or that contains a "window" for transmitting radiation. Quartz or glass can be used for this purpose, quartz being preferred because of its higher transmission.

SPECIFIC EMBODIMENTS OF THE INVENTION

The examples which follow are illustrative and not limitative of the invention. Unless otherwise stated, all parts and percentages are by weight.

EXAMPLE 1

A composition of 100 mg of N-vinylsuccinimide and 2 mg of tribenzoylphosphine was melt-crystallized twice in a vial. The solid mixture was then melt-coated onto a 10 × 13 cm aluminum lithographic plate and spread evenly with a cotton swab. The coating was crystallized by touching a corner of the coating with a wooden stick. The plate was then placed in contact with a photographic negative. The plate and negative were exposed for 4 minutes in a vacuum frame with a W–$I_2$ 1,000-watt lamp and developed in hexane-chloroform (9:1 by volume) and air-dried. A distinct image resulted, with polymer being formed in the regions which were exposed to light transmitted by the negative.

EXAMPLE 2

A composition of 124 mg of N-vinylsuccinimide and 16 mg of tribenzoylphosphine was prepared. The mixture (20 mg) was melt-crystallized on an aluminum plate and exposed in contact with a Kodak 1A step wedge in a vacuum frame. The exposure was for 4 minutes with a 1,000-watt tungsten-iodine lamp. The plate was then developed in hexane-chloroform (9:1 by volume to give an image of eight steps of the wedge.

Experiments paralleling Examples 1 and 2 using triphenylphosphine in place of the tribenzoylphosphine gave no, or a barely perceptible, image.

EXAMPLE 3

A composition of diphenoxyethane, 0.02 g of 4-acryloxybenzophenone and 0.005 g of tribenzoylphosphine was melt-crystallized three times in a vial. The resulting solid (20 mg) was then melt-coated on a 3 × 8 cm aluminum lithographic plate. The melt was crystallized by touching with an applicator stick. The coating was then exposed in air in contact with a 1A-step tablet for 1 minute to a 1,000-watt tungsten-iodine lamp. The plate was developed in hexane-chloroform (9:1 by volume) and air-dried. A polymer image of ten steps resulted, indicating image formation at about 12 $\mu$j/cm$^2$ of incident radiation. When the plate was inked in the usual way, the ink adherred to the polymeric image.

EXAMPLE 4

A solution of 0.95 g of freshly distilled methyl methacrylate and 0.004 g of tribenzoylphosphine was placed in a Kimax* (*Kimax vessels are suitable for small scale studies because of their somewhat high absorption of ultraviolet radiation. The optical density of Kimax vessels at 310 nm is 0.35 while that of Pyrex vessels is 0.08. This shows that the triaroylphosphines are effective at rather lower energy radiation than many photoinitiators that require ultraviolet radiation to be effective.) tube and deoxygenated by bubbling argon through the solution for 10 minutes. The tube was then closed with a screw cap and irradiated for 20 minutes with a 4350A mercury light source. The tube was then emptied into 30 ml of methanol causing a white solid to precipitate. The solid was filtered and dried in vacuo to give 183.6 mg of polymeric methyl methacrylate (19.6 percent yield). The infrared spectrum of the solid is identical to that of polymethyl methacrylate.

A companion blank experiment with no photoinitiator gave 1.1 mg of polymer (0.1 percent yield) and a parallel experiment using triphenylphosphine yielded less than 0.1 percent of polymethyl methacrylate.

EXAMPLE 5

A solution of 1.60 g of freshly distilled acrylo-nitrile and 0.004 g of tribenzoylphosphine was placed in a Kimax test tube and deoxygenated by bubbling argon through the solution for 10 minutes. The tube was then closed with a screw cap and placed in a beaker of water maintained at 24° C. the tube was irradiated with a 275-watt sunlamp for 5 minutes. At the end of 5 minutes a white solid had precipitated in the tube. The contents of the tube was transferred to a flask and the excess acrylonitrile was removed in vacuo. The residue was treated with 30 ml of methanol and the resultant precipitate was then filtered and dried in vacuo to give 536 mg (33.5 percent yield) of polymer. The infrared spectrum of this material is identical to an authentic sample of polyacrylonitrile.

A companion sample except for omission of the photoinitiator gave no insoluble polymer and a control experiment using triphenylphosphine yielded no polymer.

EXAMPLE 6

A solution of 1.80 g of styrene (freshly chromatographed over alumina to remove inhibitor) and 0.004 g of tribenzoylphosphine was placed in a Kimax test tube and deoxygenated by bubbling argon through the solution for 10 minutes. The tube was then closed with a screw cap and placed in a beaker of water maintained at 24° C. The tube was irradiated with a 275-watt sunlamp for 1 hour. The contents of the tube were washed into a flask with acetone and evaporated in vacuo to remove the unreacted styrene. The nonvolatile residue was dissolved in 1 ml of benzene. Methanol (30 ml) was then added to precipitate a white solid. The solid was filtered, dried in vacuo to give 51.6 (2.9 percent yield) of polystyrene. The infrared spectrum of the solid showed it to be identical with polystyrene.

A companion sample with no photoinitiator gave 17.1 mg of polymer (0.9 percent yield). Similarly an experiment in which the tribenzoylphosphine was replaced with triphenyl-phosphine gave less than 1% of polymer.

EXAMPLE 7

A composition of 100 mg of N-vinylsuccinimide and 5 mg of tribenzoylphosphine was melt-crystallized in a vial three times. The resulting solid (5 mg) was then melt-coated on a copper calorimeter plate. The plate was then exposed to monochromatic light and the resultant heat due to photopolymerization was read out on an X–Y recorder. The following data were recorded:

| Exposure No. | Wavelength—nm | Slope—mv/sec |
|---|---|---|
| 1 | 435 | 0.41 |
| 2 | 405 | 2.72 |
| 3 | 366 | 1.72 |

The data show that tribenzoylphosphine is an effective photoinitiator at each of these wavelengths.

Control experiments parallel to the above except for the use of triphenylphosphine showed no heat effect.

EXAMPLE 8

Tribenzoyl phosphine (4 mg.) was dissolved in 1.6 g. acrylonitrile (freshly chromatographed over Woelm grade I basic alumina to remove inhibitor) in a Kimax screw cap test tube which was wrapped in aluminum foil to prevent the exposure of the contents to room light. Three replicate sampels were prepared as above. The tubes were loosely capped. One sample tube was irradiated for 3 minutes with a 275-watt sunlamp and placed in a beaker of water at 27° C. The lamp was 10 cm. from the test tube. During the irradiation a white precipitate formed. The excess monomer was removed in vacuo, leaving 70 mg. (4.4 percent) of a white solid. The infrared spectrum of the solid is identical to that of polyacrylonitrile. A second sample, irradiated for ten minutes, gave 0.25 g. (15.7 percent) of polyacrylonitrile. A third and fourth sample, kept in the dark for 3 and 10 minutes, respectively, gave no polymer.

The above indicates that solution phase photopolymerization initiated by tribenzoyl phosphine proceeds even in non-deoxygenated media.

Table IV shows calorimetric results obtained by irradiation of compositions shown in col. 1 with light of various wavelengths (col. 2).

TABLE IV

| Ex. No. | Composition (mg) | Wave-length nn | Slope mv/sec | Induct-ion Per. (sec.) |
|---|---|---|---|---|
| 9 | N-Vinylsuccinimide (100) | 366 | 0.798 | 0* |
| | | 405 | 0.486 | 0 |
| | Benzoyldiphenyl phosphine (8) | 435 | 0.053 | 0 |
| | | 589 | 0.0 | 0 |
| 10 | N-Vinylsuccinimide (100) | 366 | 0.54 | 0 |
| | | 405 | 0.15 | 0 |
| | p-Dimethylaminobenzoyl diphenyl phosphine (5) | 435 | 0.026 | 0 |
| | | 589 | 0.0 | 0 |
| 11 | Diphenoxyethane (100) | 366 | 0.384 | 0 |
| | 4-n-Octyloxy-2-acryloxybenzophenone (20) | 405 | 0.121 | 0 |
| | Dibenzoyl phenyl phosphine (7) | | | |
| 12 | Diphenoxyethane (100) | 366 | 0.958 | < 1 |
| | Bis(p-dimethylaminobenzoyl phenyl phosphine (7) | 405 | 0.266 | ca 6 |
| | 4-n-Octyloxy-2-acryloxybenzophenone (20) | 435 | 0.047 | ca 20 |

*Induction time of zero indicates the polymerization started at once.

EXAMPLE 13

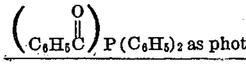
as photoinitiator

The composition diphenoxyethane (0.85 g), monobenzoyl diphenyl phosphine (0.042 g), 4-n-octyloxy-2-acryloxybenzophenone was prepared and dissolved in 15 ml of chloroform. The solution was sprayed onto two 5 × 5 cm² AO Web Best Lithographic aluminum plates. One plate was then exposed for 30 seconds in a vacuum frame under a photo composition negative. The other plate was then exposed for 30 seconds in air under a photocomposition negative and IA step wedge. The light source for both exposures was a Colortron Model 1,000 W–$I_2$ lamp, at a distance of 96 cm. Each plate was then developed in n-hexane until the polymeric image in the light-struck areas became visible. The plates were dried in air. The plate which was exposed in air gave a faint image of the photocomposition negative and showed two steps on the step wedge image, indicating a minimum sensitivity to about 1.5 mj/cm². The plate which was exposed in vacuum gave a faint image of the photocomposition negative.

EXAMPLE 14

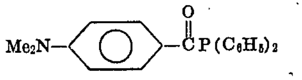
as a photoinitiator

A composition of N-vinylsuccinimide (100 mg) and p-dimethylaminobenzoyl diphenyl phosphine (5mg) was melt-crystallized twice in a vial. The resultant solid (80 mg) was then melted onto a 2 × 5 AO Web Best Lithographic aluminum plate, the melted coating was swabbed evenly with a Q-tip. The plate was cut in half. One half was then exposed in air for 5 minutes under a photocomposition negative. The other half was exposed in vacuum frame for 5 minutes under a photocomposition negative. The light source was an AH–4 mercury vapor lamp with incident intensity of 20 μw/cm² at wavelengths <4200A. Both halves were developed in hexane to give a polymeric image in the light-struck areas, indicative that an image can be formed with 6 mj of exposure dosage at these wavelengths.

EXAMPLE 15

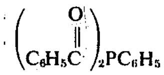
as a photoionitiator

A composition of diphenoxyethane (100 mg), di-benzoyl phenyl phosphine (7mg) and 4-n-octyloxy-2-acryloxyybenzophenone (20 mg) was melt-crystallized in a vial. The resultant solid (100 mg) was dissolved in 1 ml of chloroform and sprayed on a 1" × 5" piece of AO Web Best Lithographic aluminum. The coating was then remelted with an infrared lamp and crystallized spontaneously upon cooling. The strip was cut in half along its length. One half was exposed in air under a cover glass and in contact with a photocomposition negative. The other half was exposed in a vacuum frame in contact with a photocomposition negative. The plates were covered with cardboard strips which were removed during timed intervals to give exposure times of 1, 2, 4, 8, 16, 32 and 64 seconds. The lamp was an AH-4 mercury vapor lamp with incident intensity of 20 $\mu$w/cm$^2$. The plates were then developed in n-hexane to give polymeric images in the light-struck areas. The plate which was exposed in air gave an image at a minimum exposure of 320 $\mu$j; the vacuum exposed plate gave an image at a minimum energy of 160 $\mu$j.

EXAMPLE 16

$$\left[(CH_3)_2NC_6H_4\overset{O}{\overset{||}{C}}\right]_2PC_6H_5$$

as a photoinitiator

A composition of diphenoxyethane (100 mg), bis-(dimethylaminobenzoyl) phenyl phosphine (7 mg) and 4-n-octyloxy-2-acryloxybenzophenone (20 mg) was prepared and melt-crystallized in a glass vial. The resultant solid (120 mg) was dissolved in 1 ml of chloroform and sprayed on a 1" × 3" piece of AO Wet Best Lithographic aluminum. The sprayed coating was then remelted under an infrared lamp and the piece cut in half along its length. The two halves were then exposed by the procedure described above, developed in hexane and air-dried. The plate which was exposed in air gave a visible polymeric image in the areas receiving 40 $\mu$j, the plate which was exposed in vacuum gave a visible polymeric image on receiving 160 $\mu$j(light source — mercury vapor AH-4 lamp).

The embodiments of the invention in which an exclusive property or privilege is claimed are defined as follows:

1. A photopolymerizable composition comprising a. at least one acyl phosphine photoinitiator of the formula $$R^2-\overset{R^1}{\overset{|}{P}}-R^3$$

wherein R$^1$, R$^2$ and R$^3$, alike or different, are aryl or aroyl groups having up to 13 carbon atoms and such aryl or aroyl groups substituted with halogen of atomic number 9–35; alkyl of up to six carbon atoms; or alkoxy of up to six carbon atoms, with the proviso that at least one of R$^1$, R$^2$ and R$^3$ is aroyl, and b. at least one ethylenically unsaturated compound capable of undergoing a free radical addition polymerization with light having a wavelength of 200– nanometers, the acyl phosphine being present in the range of 0.01 to 20 percent by weight based on the weight of the ethylenically unsaturated compound.

2. A composition according to claim 1 which is predominantly crystalline.

3. A composition according to claim 1 wherein the range of the acyl phosphine is 0.20 to 20 percent.

4. A composition according to claim 1 wherein the acyl phosphine is tribenzoyl phosphine.

5. A composition according to claim 1 wherein the acyl phosphine is diphenylbenzoylphosphine.

6. A composition according to claim 1 wherein the acyl phosphine is p-dimethylaminobenzoyldiphenylphosphine.

7. A composition according to claim 1 wherein the acyl phosphine is dibenzoylphenylphosphine.

8. A composition according to claim 1 wherein the acyl phosphine is bis(p-dimethylaminobenzoyl phenylphosphine.

9. A composition according to claim 4 wherein the ethylenically unsaturated compound is N-vinylsuccinimide.

10. A composition according to claim 4 wherein the ethylenically unsaturated compound is 4-acryloxybenzophenone.

11. A composition according to claim 4 wherein the ethylenically unsaturated compound is methyl methacrylate.

12. A composition according to claim 4 wherein the ethylenically unsaturated compound is acrylonitrile.

13. A composition according to claim 4 wherein the ethylenically unsaturated compound is styrene.

* * * * *

PO-1050
(5/69)

UNITED STATES PATENT OFFICE
CERTIFICATE OF CORRECTION

Patent No. 3,668,093 Dated June 6, 1972

Inventor(s) Thomas Albert Rettig

It is certified that error appears in the above-identified patent and that said Letters Patent are hereby corrected as shown below:

Col. 2, line 6, cancel "10"; line 7, change "5.5°C" to -- 105.5°C. --.

Col. 6, line 28, correct the spelling of "phosphine".

Col. 8, Example 4 should be rewritten:

-- EXAMPLE 4

A solution of 0.95 g of freshly distilled methyl methacrylate and 0.004 g of tribenzoylphosphine was placed in a Kimax®* tube and deoxygenated by bubbling argon through the solution for 10 minutes. The tube was then closed with a screw cap and irradiated for 20 minutes with a 4350A mercury light source. The tube was then emptied into 30 ml of methanol causing a white solid to precipitate. The solid was filtered and dried in vacuo to give 183.6 mg of polymeric methyl methacrylate (19.6% yield). The infrared spectrum of the solid is identical to that of polymethyl methacrylate.

A companion blank experiment with no photoinitiator gave 1.1 mg of polymer (0.1% yield) and a parallel experiment using triphenylphosphine yielded less than 0.1% of polymethyl methacrylate.

*Kimax® vessels are suitable for small scale studies because of their somewhat high absorption of ultraviolet radiation. The optical density of Kimax® vessels at 310 nm is 0.35 while that of Pyrex® vessels is 0.08. This shows that the triaroylphosphines are effective at rather lower energy radiation radiation than many photoinitiators that require ultraviolet radiation to be effective. --.

(continued on next sheet)

PO-1050
(5/69)

UNITED STATES PATENT OFFICE
CERTIFICATE OF CORRECTION

Patent No. 3,668,093 Dated June 6, 1972

Inventor(s) Thomas Albert Rettig

It is certified that error appears in the above-identified patent and that said Letters Patent are hereby corrected as shown below:

(continued from first sheet)

Col. 9, line 14, after "51.6" insert -- mg --.

Col. 12, line 13, after "200-" insert -- 435 --.

Signed and sealed this 9th day of January 1973.

(SEAL)
Attest:

EDWARD M.FLETCHER,JR.
Attesting Officer

ROBERT GOTTSCHALK
Commissioner of Patents